US011832412B1

(12) United States Patent
Braun

(10) Patent No.: US 11,832,412 B1
(45) Date of Patent: Nov. 28, 2023

(54) UNIVERSAL MOUNTING DEVICE FOR PRINTED CIRCUIT BOARDS

(71) Applicant: Braun Research Corporation, Alta Loma, CA (US)

(72) Inventor: Kurt Braun, Alta Loma, CA (US)

(73) Assignee: Braun Research Corporation, Alta Loma, CA (US)

( * ) Notice: Subject to any disclaimer, the term of this patent is extended or adjusted under 35 U.S.C. 154(b) by 717 days.

(21) Appl. No.: 16/994,895

(22) Filed: Aug. 17, 2020

(51) Int. Cl.
*H05K 7/14* (2006.01)

(52) U.S. Cl.
CPC ........... *H05K 7/142* (2013.01); *H05K 7/1407* (2013.01)

(58) Field of Classification Search
CPC .............................. H05K 7/142; H05K 7/1407
USPC ..... 248/285.1, 286.1, 287.1, 298.1; 361/807, 361/770
See application file for complete search history.

(56) References Cited

U.S. PATENT DOCUMENTS

| 7,184,277 B2 * | 2/2007 | Beirne | G07F 17/3202 |
| | | | 361/807 |
| 2003/0210532 A1 * | 11/2003 | Le | H05K 7/142 |
| | | | 361/758 |
| 2007/0097649 A1 * | 5/2007 | Yang | H01L 23/4006 |
| | | | 257/E23.084 |
| 2010/0073889 A1 * | 3/2010 | Olson | H05K 7/142 |
| | | | 361/752 |
| 2017/0105307 A1 * | 4/2017 | Braun | H05K 7/1474 |

* cited by examiner

*Primary Examiner* — Muhammad Ijaz
(74) *Attorney, Agent, or Firm* — Lowe Graham Jones PLLC; Ellen M. Bierman

(57) ABSTRACT

Embodiments are directed toward a mounting device for circuit boards. The mounting device preferably includes a first standoff and a first track. The first standoff is preferably configured to receive a circuit board. The first track is preferably be configured to receive the first standoff. The first standoff is preferably configured to move relative to the first track in two dimensions to facilitate receiving different circuit boards having different sizes or dimensions.

26 Claims, 21 Drawing Sheets

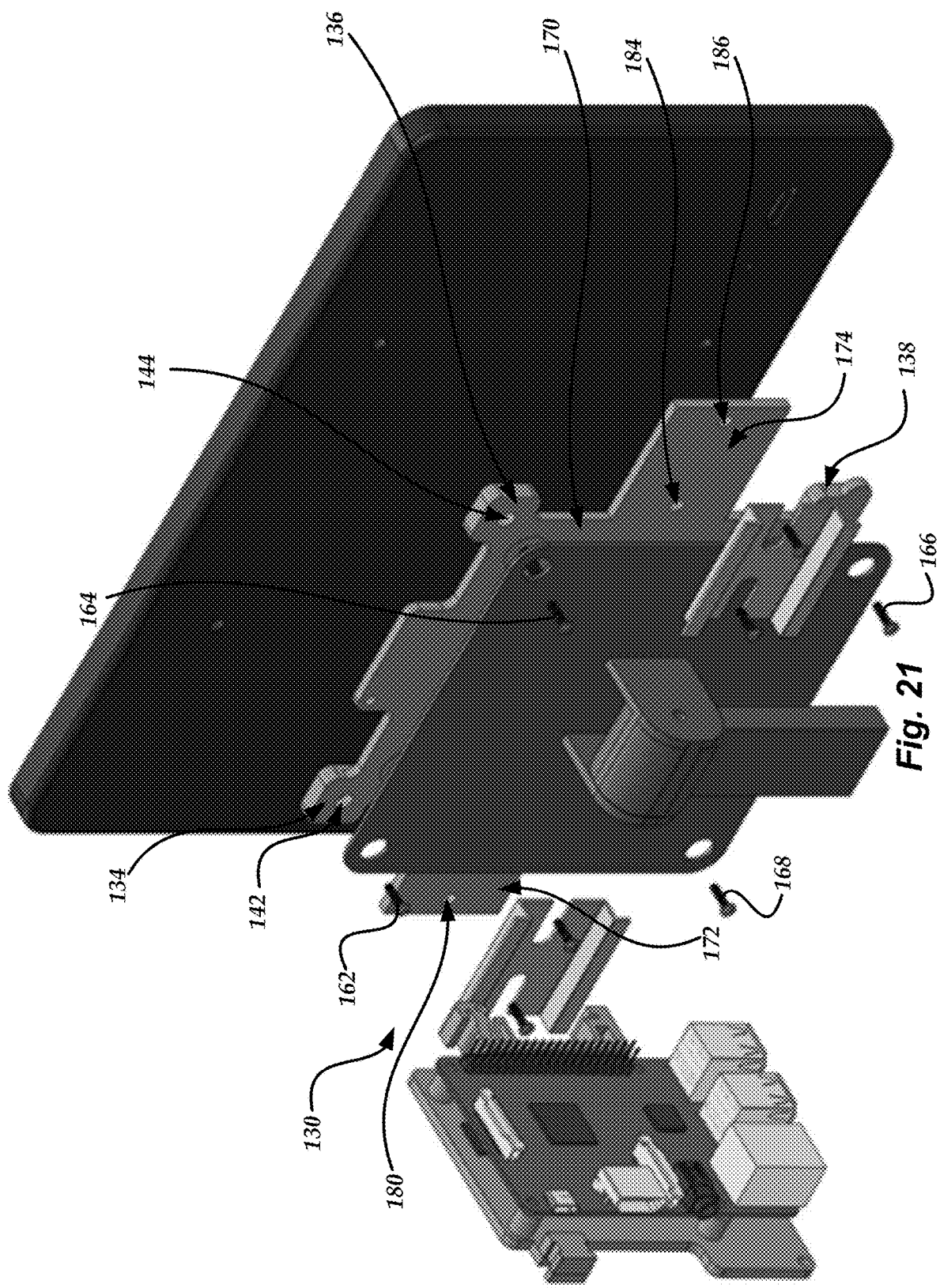

UNIVERSAL MOUNTING DEVICE FOR PRINTED CIRCUIT BOARDS

FIELD OF THE INVENTION

The invention relates generally to mounting devices for printed circuit boards and, more particularly, to universal mounting devices for printed circuit boards having various hole patterns.

BACKGROUND OF THE INVENTION

Printed circuit boards ("PCBs") come in various shapes and sizes and have a variety of different hole patterns for mounting the PCBs. PCBs are typically mounted with four screws and therefore typically define a screw hole in each corner of the PCB. Accordingly, suppliers of mounting devices must keep inventory of such devices with different sizes and screw-hole patterns, which increases costs for consumers and logistical complexities for manufacturers and suppliers. Moreover, consumers must be careful to verify that a given mounting device is configured to receive the particular PCB that the consumer desires to mount, which leads to frustration when consumers purchase mounting devices that are incompatible with their PCBs.

SUMMARY OF THE INVENTION

It is therefore an object of the present invention to provide mounting devices for printed circuit boards that are configured to receive circuit boards having a wide range of hole patterns.

It is also an object of the present invention to provide mounting devices for printed circuit boards that achieve the above object and that also are configured to receive circuit boards having a wide range of sizes.

It is another object of the present invention to provide mounting devices for printed circuit boards that achieve the above objects and that also facilitate mounting circuit boards to rails that comply with the Deutsche Industrie Normen ("DIN") standard.

It is a further object of the present invention to provide mounting devices for printed circuit boards that achieve the above objects and that also facilitate mounting circuit boards to monitors or televisions.

It is yet another object of the present invention to provide mounting devices for printed circuit boards that achieve the above objects and that also facilitate mounting circuit boards to monitors or televisions while the monitor or television is supported by a stand that complies with the Flat Display Mounting Interface ("FDMI") standard.

The invention achieves the above objects, as well as other objects and advantages that will become apparent from the description that follows, by providing a mounting device for circuit boards. The mounting device preferably includes a first standoff and a first track. The first standoff is preferably configured to receive a circuit board. The first track is preferably configured to receive the first standoff. The first standoff is preferably configured to move relative to the first track in two dimensions to facilitate receiving different circuit boards having different sizes or dimensions.

The first standoff is preferably configured to translate relative to the track and rotate relative to the track. In some versions, the first standoff has a base that is configured to be received by the first track. The first standoff preferably has an arm that has a proximal end portion coupled to the base and a distal end portion opposite the proximal end portion. The distal end portion is preferably configured to receive the circuit board.

The base is preferably configured to translate relative to the first track. The arm is preferably configured to rotate relative to the first track. In some versions, the first standoff or the first track is configured to enable the proximal end portion to be disposed at a position when the arm is disposed in a first orientation and to enable the proximal end portion to be disposed at the position when the arm is disposed in a second orientation that is transverse to the first orientation.

In some versions, the first track has an effective length that is at least twice as long as an effective length of the arm. The effective length of the arm is preferably defined by a distance between an axis around which the arm is configured to rotate and a center of the distal end portion of the arm that is configured to receive the circuit board. The first track is preferably configured to allow the first standoff to move from a first position where the axis is disposed at a first location to a second position where the axis is disposed at a second location. The effective length of the first track is preferably defined by a distance between the first location and the second location.

In some versions, the first track has an elevated portion and a recessed portion, such portions being elevated or recessed at least relative to each other. In some versions, the elevated portion is elevated relative to a surface of a plate in which the track is disposed. In some versions, the recessed portion is recessed relative to the surface of the plate. In other versions, elevated portion is substantially flush with the surface of the plate, or the recessed portion is substantially flush with the surface of the plate. The elevated portion and the recessed portion are preferably spaced apart by a distance. The arm preferably has a bottom surface that has a height relative to a bottom surface of the base. The height is preferably at least as great as the distance.

In some versions, the first standoff has a spacer disposed at the distal end portion of the arm. The spacer is preferably configured to define a gap between the arm and a surface of the received circuit board that faces the first standoff. The arm preferably has a length that is greater than a width of the first track as measured in a plane that is substantially parallel to the arm when the first standoff is received by the track.

In some versions, the first standoff preferably defines a base-mounting hole. The first track preferably defines a slot. The base-mounting hole and the slot are preferably configured to receive a standoff-securing fastener to couple the first standoff to the first track.

In some versions, the device includes a second standoff and a second track. The second standoff is preferably configured to receive the circuit board. The second track is preferably configured to receive the second standoff. The second standoff is preferably configured to move relative to the second track. The first track preferably has a first longitudinal axis. The second track preferably has a second longitudinal axis. The second longitudinal axis is preferably oriented at an acute angle relative to the first longitudinal axis. In some versions, the second longitudinal axis is oriented at an obtuse angle relative to the first longitudinal axis. The first standoff and the second standoff are preferably configured to receive a first circuit board that is shaped and dimensioned such that the first circuit board does not overlap the first track and does not overlap the second track when received by the first standoff and the second standoff and viewed from a direction that is substantially orthogonal to a surface of the first circuit board that faces the first standoff and the second standoff. In some versions, the first standoff and the second standoff are configured to receive a second circuit board that is shaped and dimensioned such that the second circuit board overlaps the first track and overlaps the second track when received by the first standoff and the second standoff and viewed from a direction that is substantially orthogonal to a surface of the second circuit board that faces the first standoff and the second standoff. In some versions, the first standoff and the second standoff are configured to receive a third circuit board that has an asymmetrical mounting-hole pattern.

In some versions, the mounting device includes a mount mechanism coupled to the first track and configured to mount the first track to a DIN rail. In some versions, the mounting device includes a mount mechanism coupled to the first track and configured to mount the first track to structure in a manner that complies with FDMI standard. In some versions, the mounting device includes a mount mechanism coupled to the first track and configured to mount the first track to a structure in a manner that complies with FDMI standard or to a first DIN rail. In some versions, the mounting device includes a rail receiver coupled to the mount mechanism. The rail receiver is preferably configured to receive a second DIN rail. In some versions, the rail receiver is configured to be coupled to the second DIN rail while the first standoff is coupled to the received circuit board and the first track. In some versions, the rail receiver is configured to be coupled to the second DIN rail while the first track is disposed between and coupled to the structure and another structure in the manner that complies with the FDMI standard.

BRIEF DESCRIPTION OF THE DRAWINGS

Preferred and alternative examples of the present invention are described in detail below with reference to the following drawings.

FIG. 21 is a front-left isometric perspective exploded view of the mounting device of FIG. 17 with a monitor that complies with the FDMI standard, two DIN rails, a printed circuit board mounted on another mounting device that is configured to couple to one of the DIN rails, and a monitor stand that complies with the FDMI standard.

DETAILED DESCRIPTION OF THE PREFERRED EMBODIMENT

Figure 1:
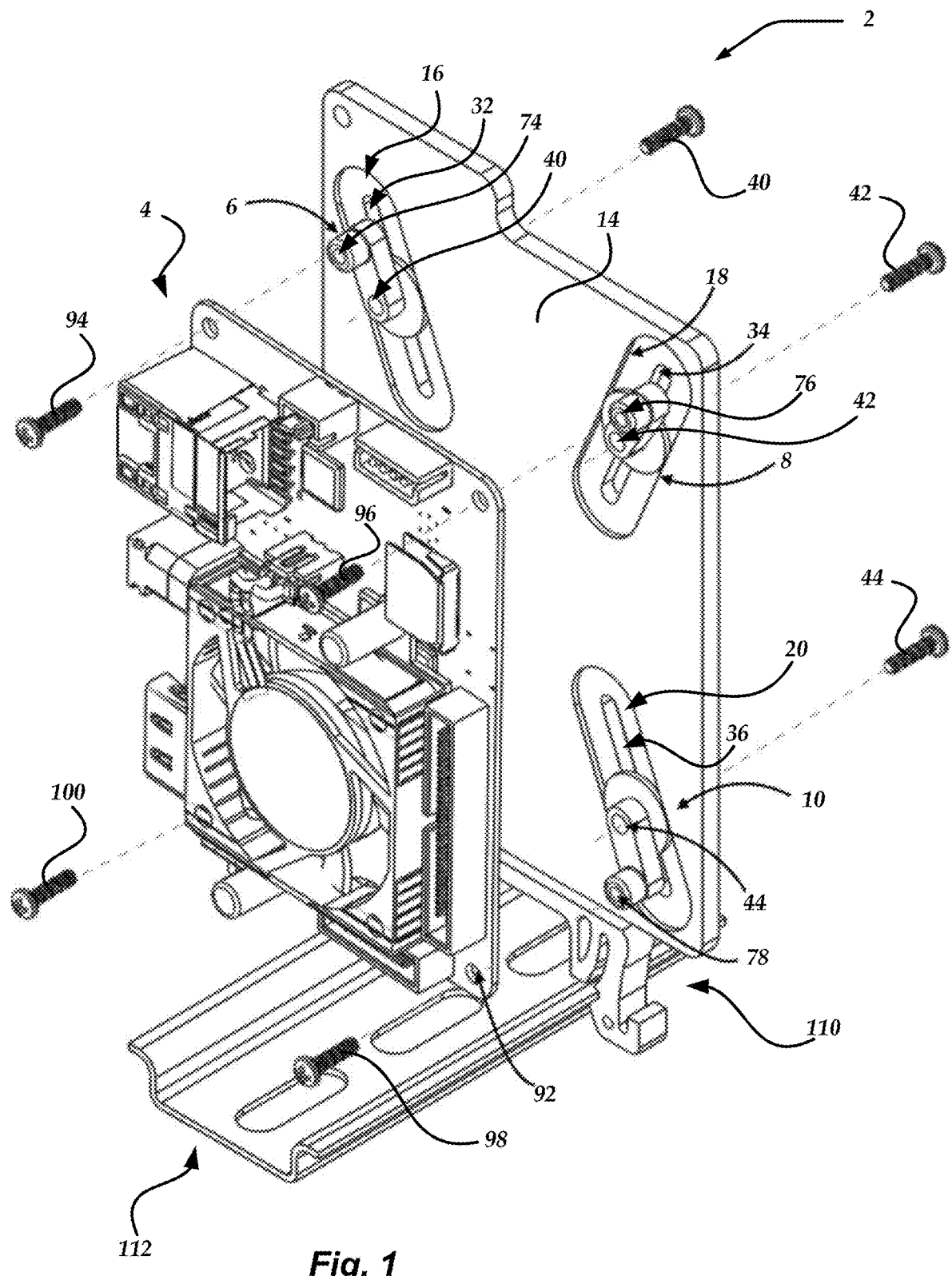
FIG. 1 is a front-left isometric perspective view of a preferred mounting device for printed circuit boards.

A preferred mounting device 2 for printed circuit boards in accordance with the principles of the invention is shown in FIG. 1. The mounting device 2 is configured to receive different circuit boards, such as the PCB 4, over a large and continuous range of shapes, sizes, and screw-hole patterns. The mounting device 2 preferably has standoffs, such as standoffs 6-12 (see FIG. 2), and a mounting plate 14 that has one or more tracks, such as tracks 16-22 (see FIG. 2), that are configured to receive the standoffs. The standoffs 6-12 are preferably moveable in the tracks 16-22 to facilitate receiving different circuit boards over the large and continuous range of shapes (for example, square, rectangular, or other polygonal), sizes, and screw-hole patterns.

Figure 3:
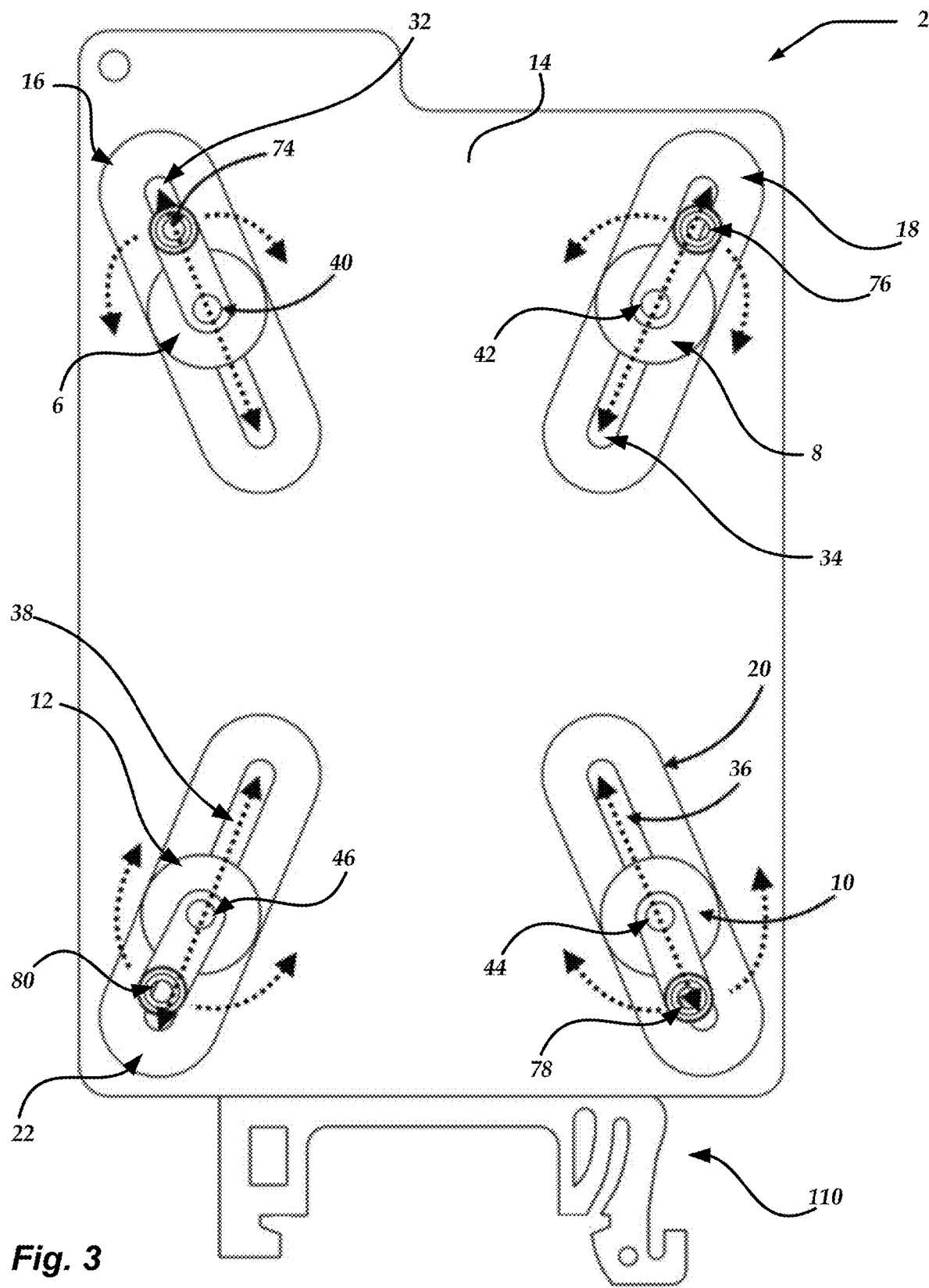
FIG. 3 is front elevational view of the mounting device of FIG. 1 with superimposed movement indicators shown with dotted lines.

As shown by the dashed lines in FIG. 3, the standoffs 6-12 are preferably configured to rotate in the tracks 16-22 and translate along the tracks 16-22. The tracks 16-22 preferably define slots, such as slots 32-38. The standoffs 6-12 preferably define base-mounting holes 40-46. The base-mounting holes 40-46 and the slots 32-38 are preferably configured to align with each other when the tracks 16-22 receive the standoffs 6-12 to facilitate standoff-securing fasteners, such as standoff-securing fasteners 48-52 (fourth standoff-securing fastener not shown), being received through the slots 32-38 and in the base-mounting holes 40-46 (see FIG. 1). Accordingly, the standoffs 6-12 are preferably movably coupled to the mounting plate 14.

Figure 2:
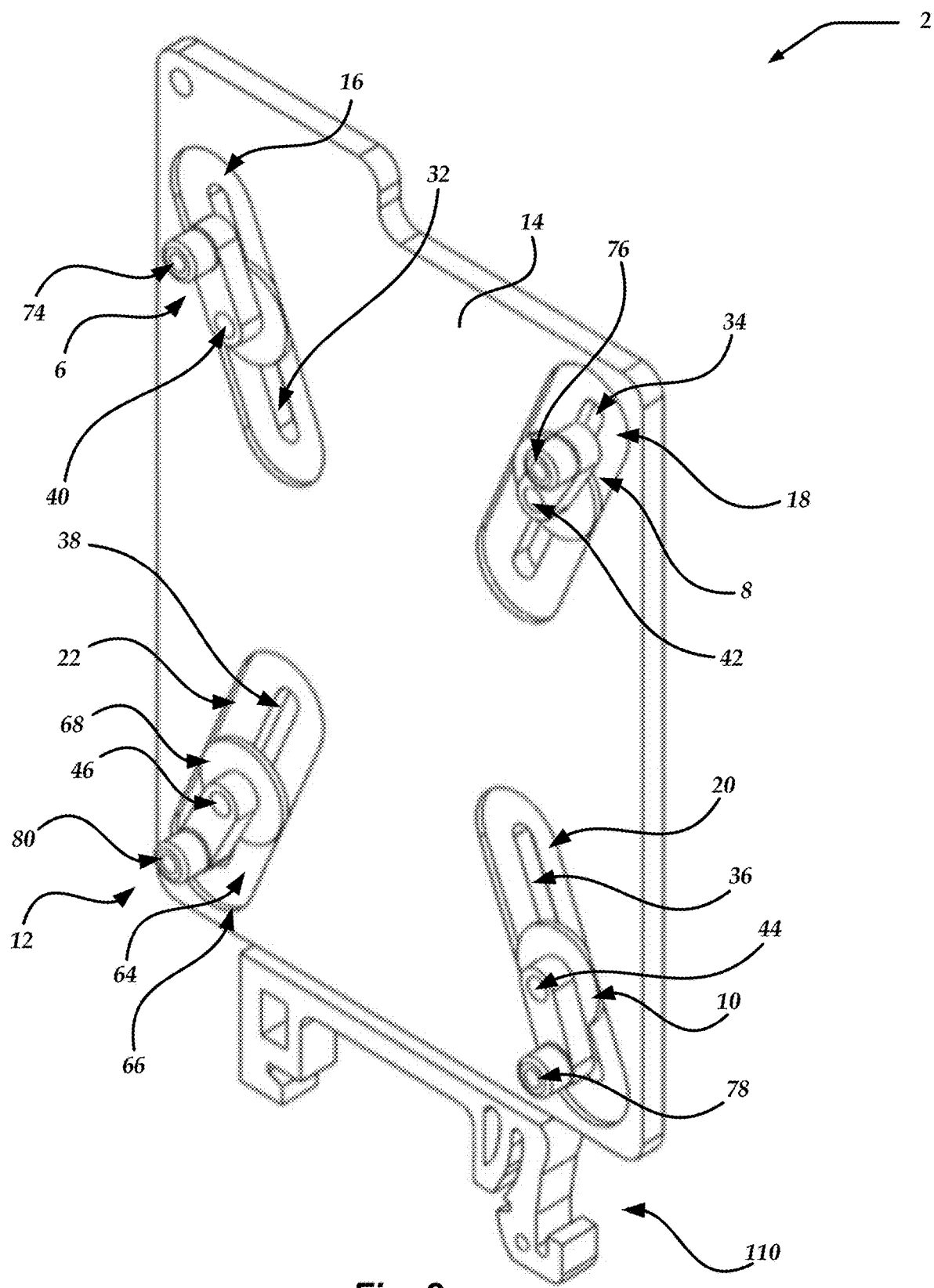
FIG. 2 is a front-left isometric perspective view of the mounting device of FIG. 1.

Each track preferably has a portion, such as the perimeter of the track, that is elevated relative to a track surface on which a base of a standoff resides. For example, as shown in FIG. 2, the track 22 has a track surface 64 that is recessed relative to the perimeter 66, and the base 68 of the standoff 12 is disposed on the recessed track surface 64 such that the perimeter 66 facilitates retaining the standoff 12 in the track 22. In some versions, such elevated portions of the tracks are also elevated relative to surrounding portions of the mounting plate 14 (see FIG. 15). In some versions, the track surfaces of the tracks are in the same plane as such surrounding portions of the mounting plate (see FIG. 15).

Figure 4:
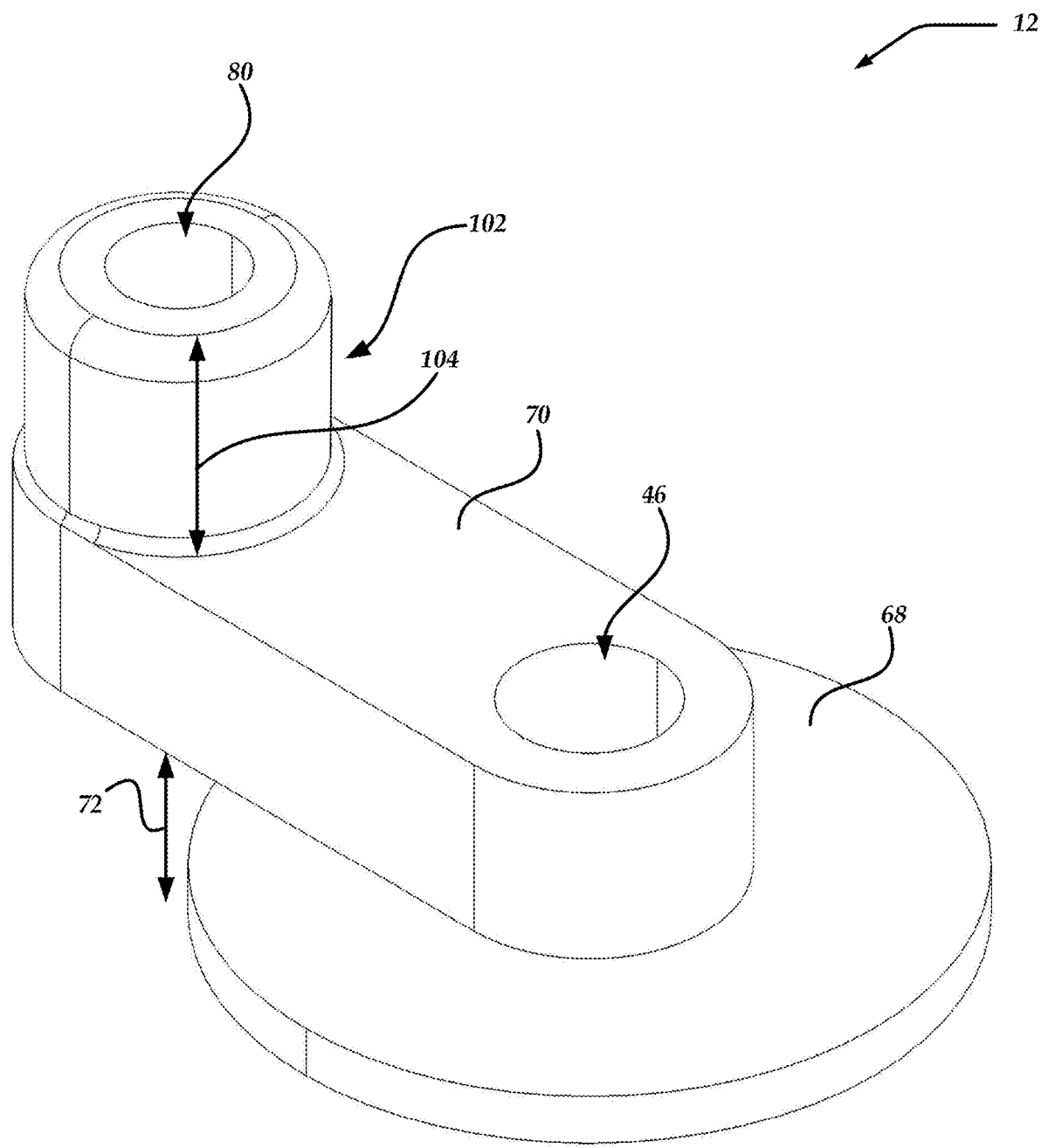
FIG. 4 is an isometric perspective view of a translating and rotating standoff of the mounting device of FIG. 1.

Each standoff preferably has a base, such as the base 68 of the standoff 12 as shown in FIG. 4, configured to be received by one of the tracks 16-22. Each standoff preferably has an arm, such as the arm 70 of the standoff 12. The arm preferably has a proximal end portion coupled to the base and a distal end portion opposite the proximal end portion. The height of the bottom of the arm relative to the bottom of the base, such as height 72, is preferably at least as great as the distance between the track surface and the perimeter of the track (i.e., the depth of the track) to facilitate the arm extending over and beyond the perimeter of the track. A portion of the standoff preferably defines a board-mounting hole, such as the board-mounting holes 74-80 (see FIG. 2), that are configured to align with mounting holes in circuit boards (for example, mounting hole 92 in FIG. 1) to facilitate receiving board-securing fasteners (for example, 94-100 in FIG. 1) that couple a circuit board to the standoffs. Each standoff preferably includes a spacer, such as the spacer 102 shown in FIG. 4, that defines the board-mounting hole. The spacer is preferably disposed at the distal end portion of the arm. The spacer is preferably disposed opposite the arm from the base. The spacer preferably has a height (for example, height 104 in FIG. 4) sufficient to create a gap between the bottom of the circuit boards and the top of the arm, thereby protecting components and connections disposed on the underside of the circuit boards.

Figure 5:
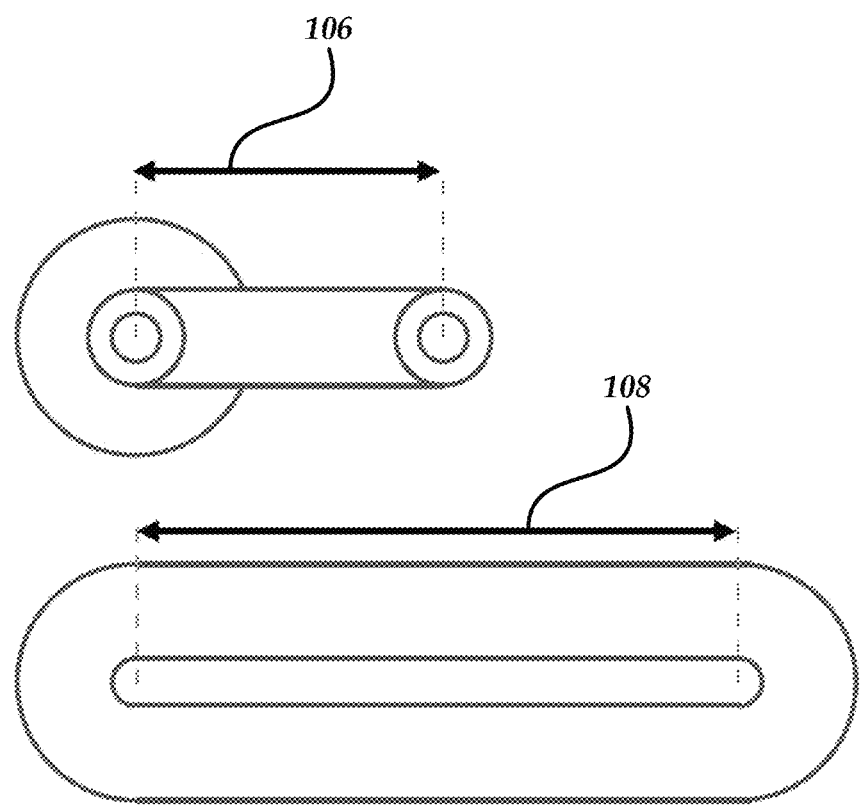
FIG. 5 is a front elevational view of the standoff of FIG. 4 and a track of the mounting device of FIG. 1.
Figure 6:
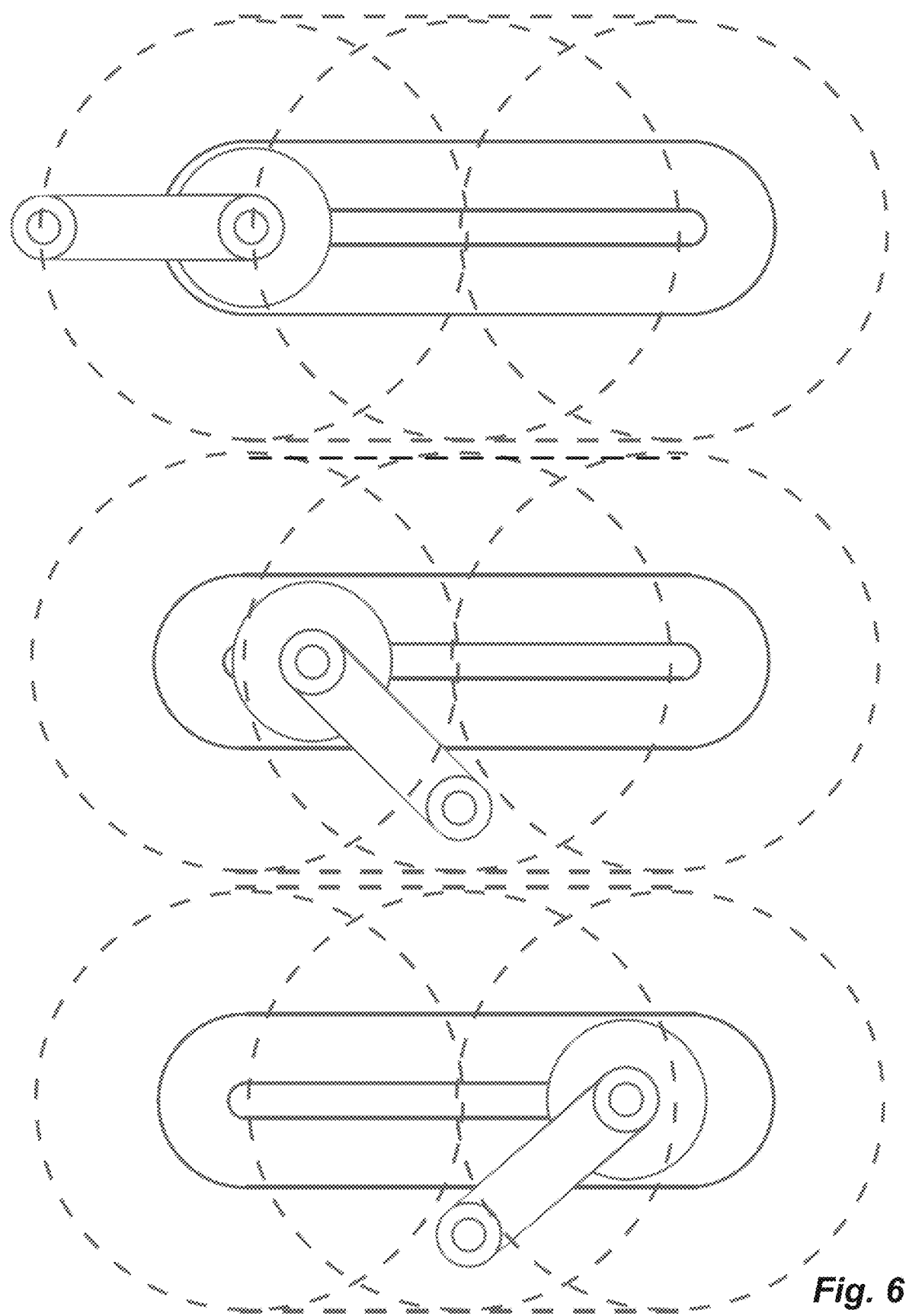
FIG. 6 is a front elevational view of the standoff of FIG. 4 in the track of FIG. 5 with superimposed coverage indicators shown with dashed lines.
Figure 7:
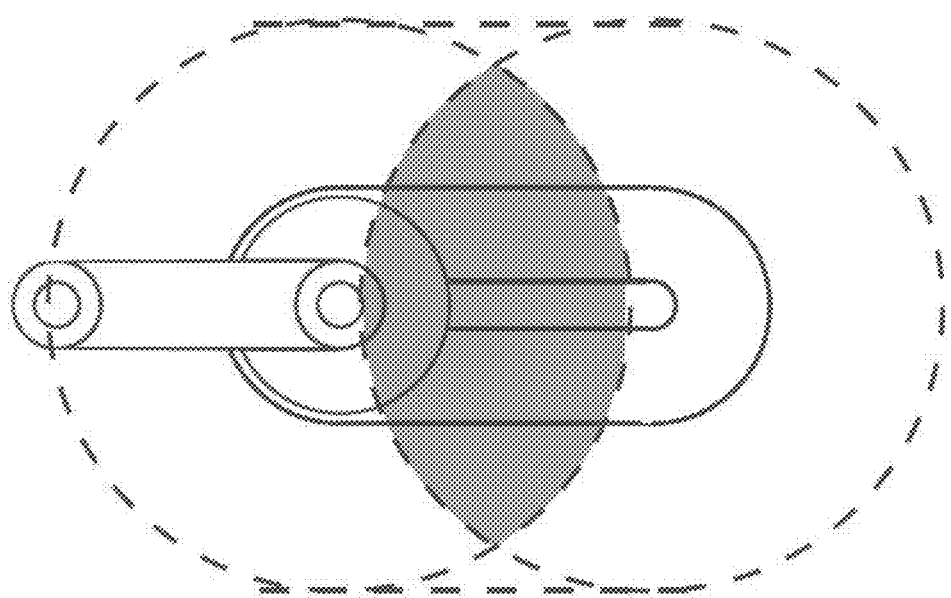
FIG. 7 is a front elevational view of the standoff of FIG. 4 in track that is shorter than the track of FIG. 5 with superimposed coverage indicators shown with dashed lines.
Figure 8:
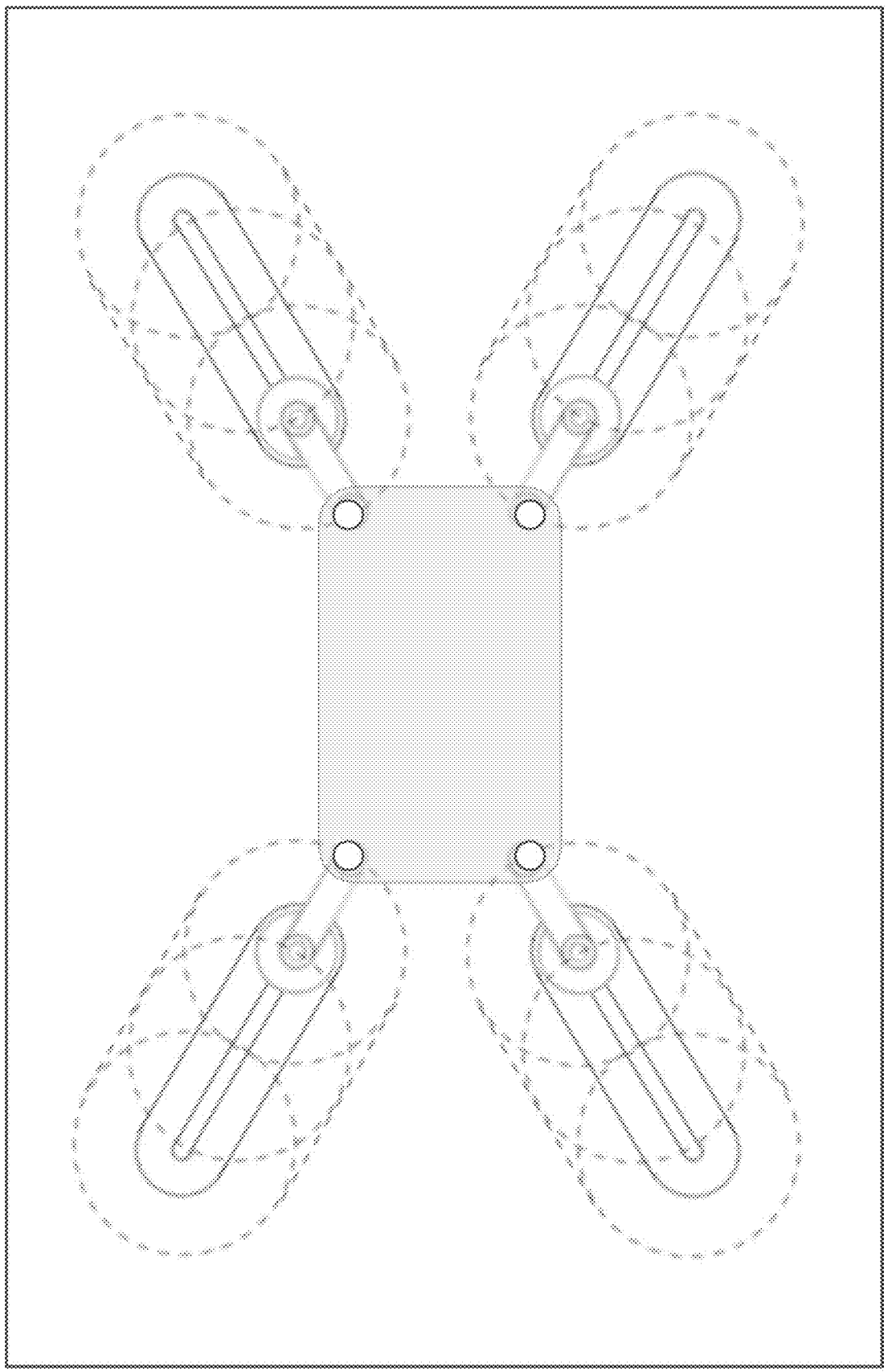
FIG. 8 is a front elevational view of a portion of the mounting device of FIG. 1 with superimposed coverage indicators shown with dashed lines and a small translucent circuit board.
Figure 9:
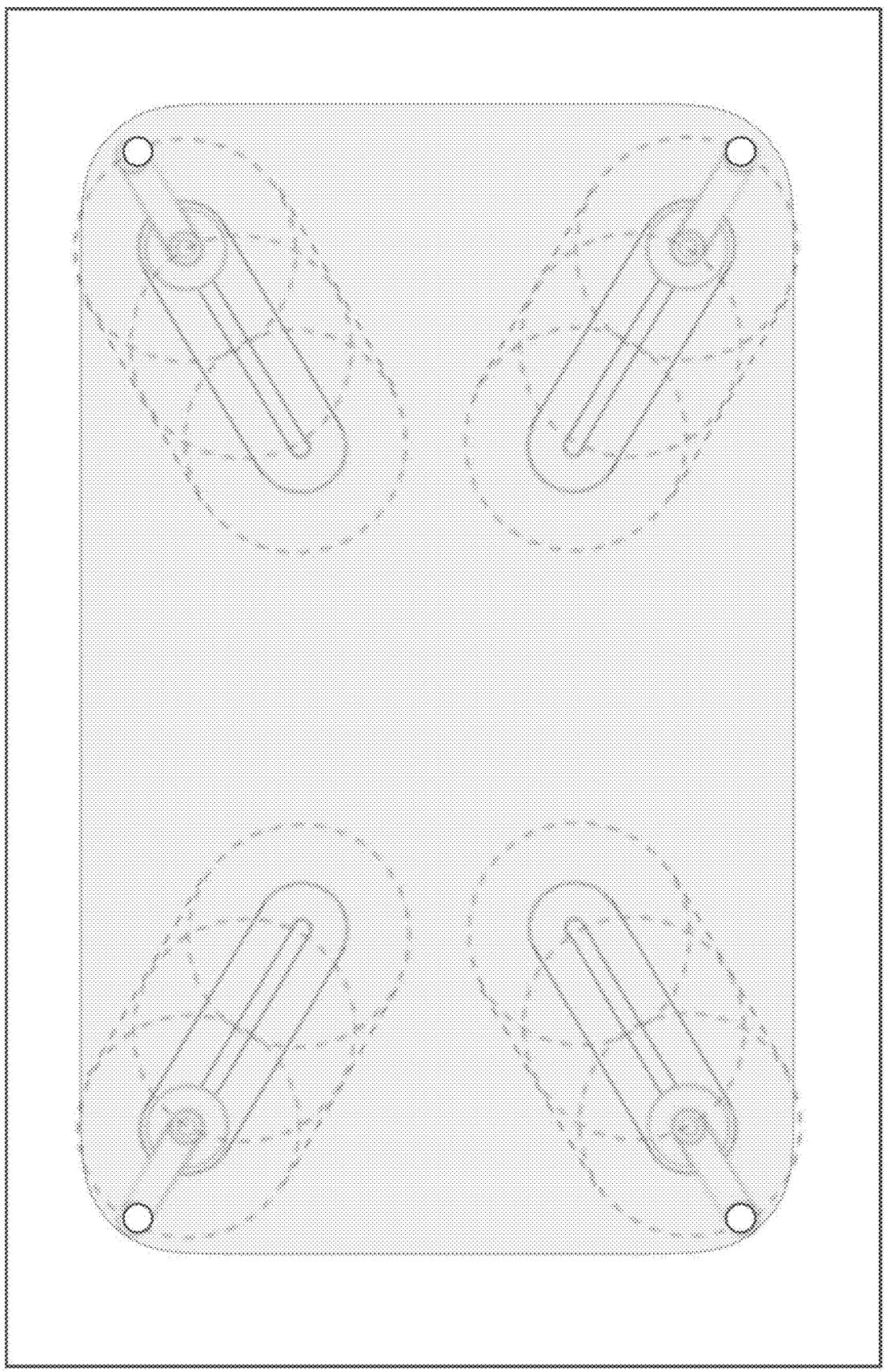
FIG. 9 is a front elevational view of a portion of the mounting device of FIG. 1 with superimposed coverage indicators shown with dashed lines and a large translucent circuit board.
Figure 10:
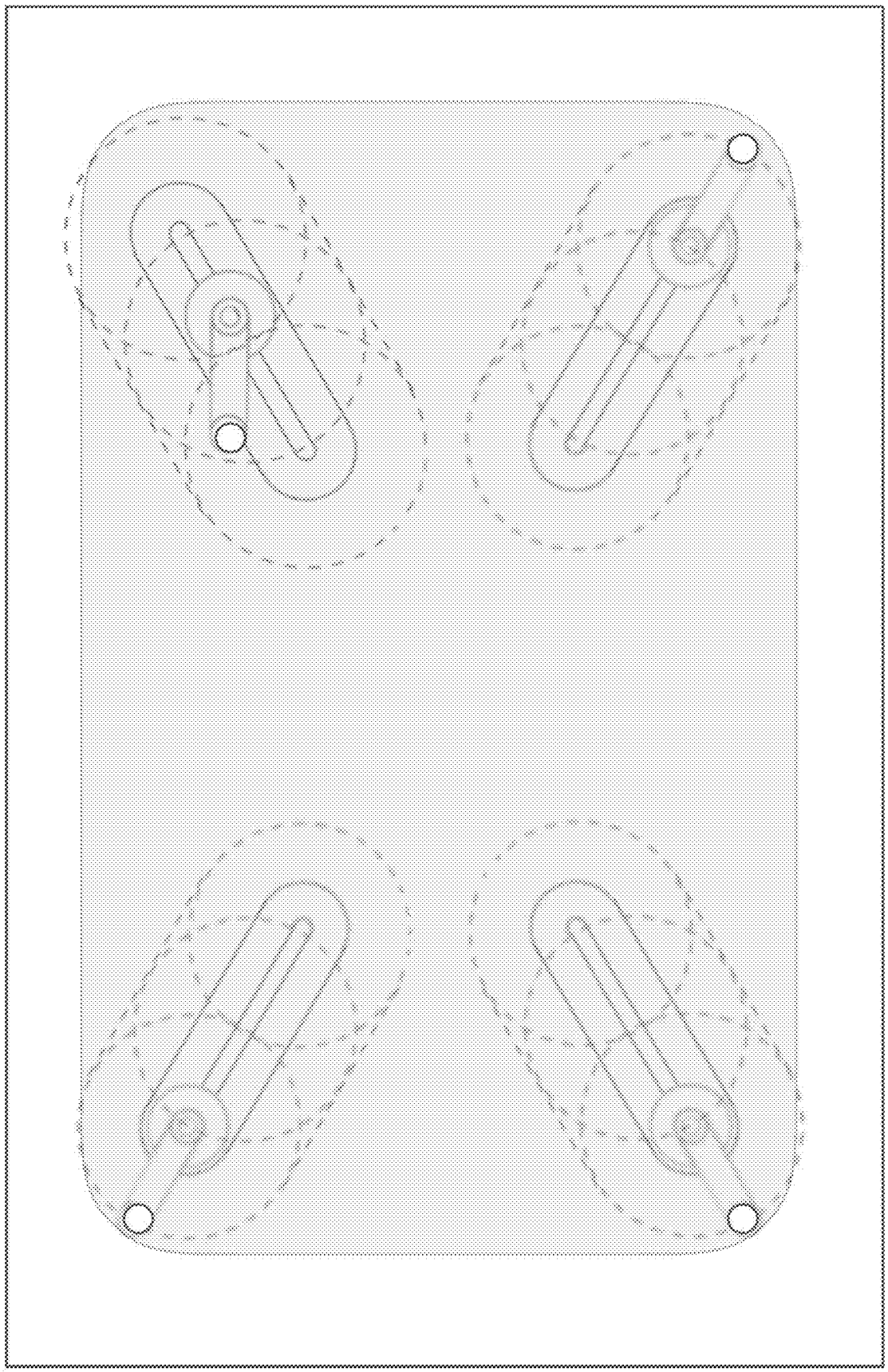
FIG. 10 is a front elevational view of a portion of the mounting device of FIG. 1 with superimposed coverage indicators shown with dashed lines and a translucent circuit board having an asymmetric screw-hole pattern.

The central axis of the board-mounting hole in each standoff is preferably spaced apart from the central axis of the base-mounting hole in the standoff by a distance, such as the distance 106 in FIG. 5, that defines the effective length of the arm. The slot in each track preferably has an effective length, such as the effective length 108 in FIG. 5, that is defined by the total length of the slot minus the diameter of the standoff-securing fastener that secures the fastener received by the track. The effective length of the slot is preferably at least twice the distance between the central axes of the board-mounting hole and the base-mounting hole of the standoff received by the track. Such relationship between the effective length and the distance facilitates the central axis of the board-mounting hole being positioned anywhere within the dashed lines of FIG. 6. Accordingly, the arrangement of the standoffs 6-12 and the tracks 16-22 enables the device 2 to receive and secure a small circuit board as represented by the shaded region in FIG. 8, a large circuit board as shown in FIG. 9, a circuit board having an asymmetrical mounting-hole pattern as shown in FIG. 10, and a continuous range of hole patterns in between. Moreover, such arrangement enables a given standoff to have its base positioned in either of two positions while positioning its board-mounting hole in the same position in the central dashed-line circle of FIG. 6 (see the bottom two schematic representations in FIG. 6), which facilitates moving the arm out of the weigh of components on the underside of the circuit board that would otherwise present clearance problems. In some versions, the effective length is less than twice the distance between the central axes of the board-mounting hole and the base-mounting hole of the standoff received by the track, which, as shown in FIG. 7, precludes the central axis of the board-mounting hole being disposed in the shaded region but facilitates providing a compact mounting device and increases rigidity of the plate 14.

Figure 11:
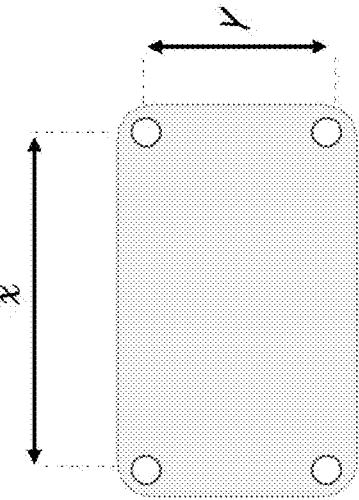
FIG. 11 is a table showing common models of circuit boards and their screw-hole positions.
Figure 12:
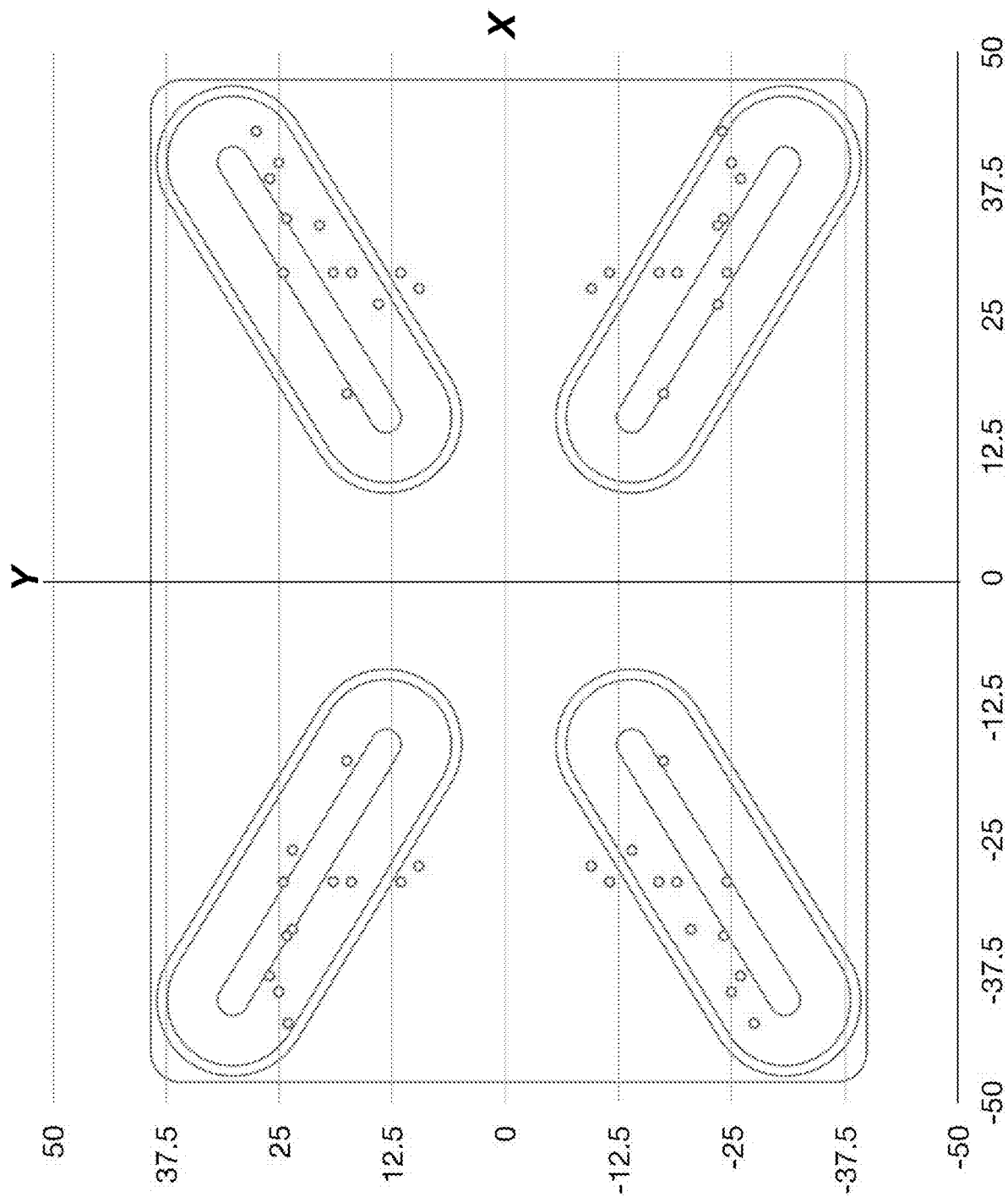
FIG. 12 is scatter plot showing the screw-hole positions of FIG. 11 relative to the tracks with the mounting device of FIG. 1 superimposed on the scatter plot.
Figure 13:
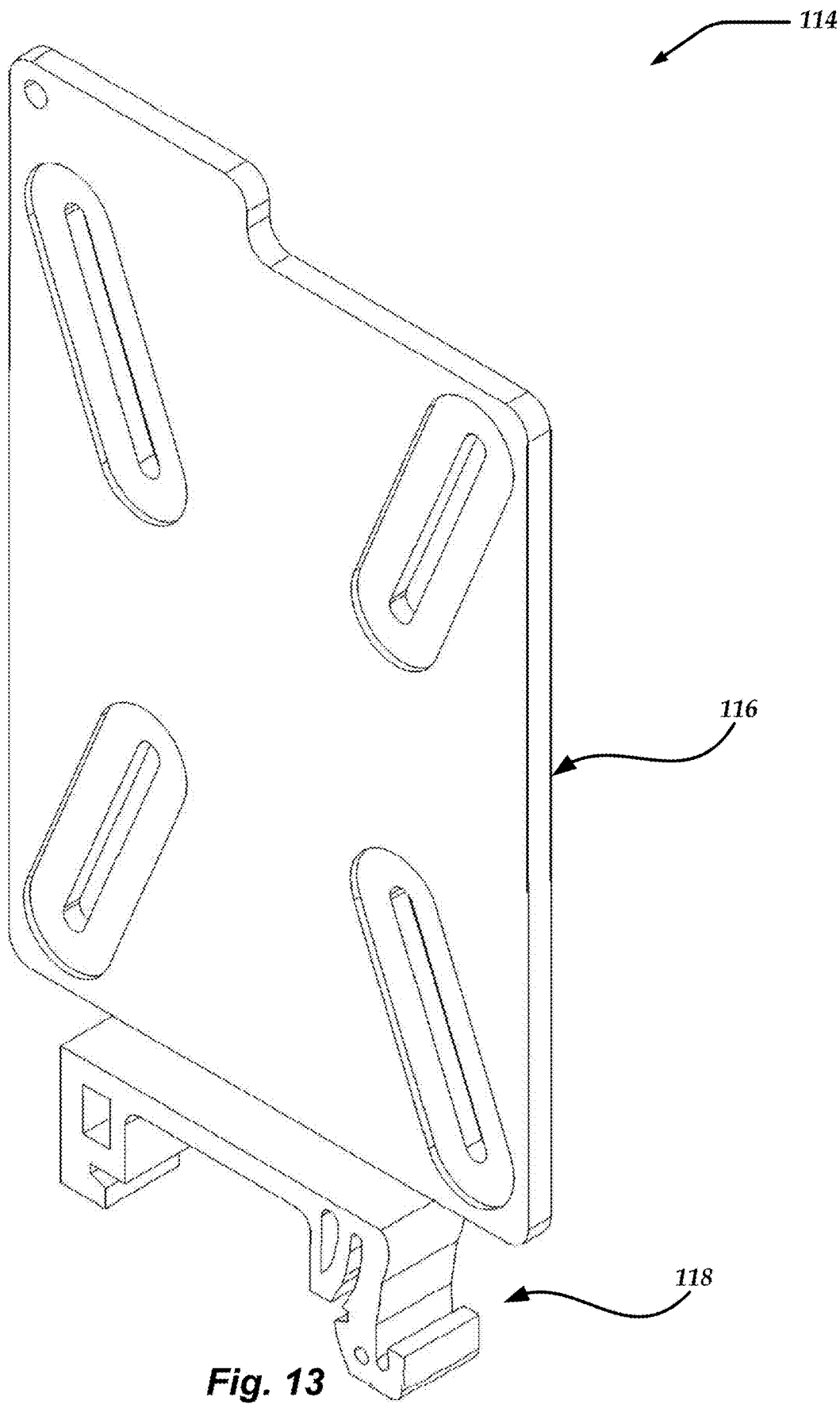
FIG. 13 is a front-left isometric perspective view of another preferred mounting device for printed circuit boards.
Figure 14:
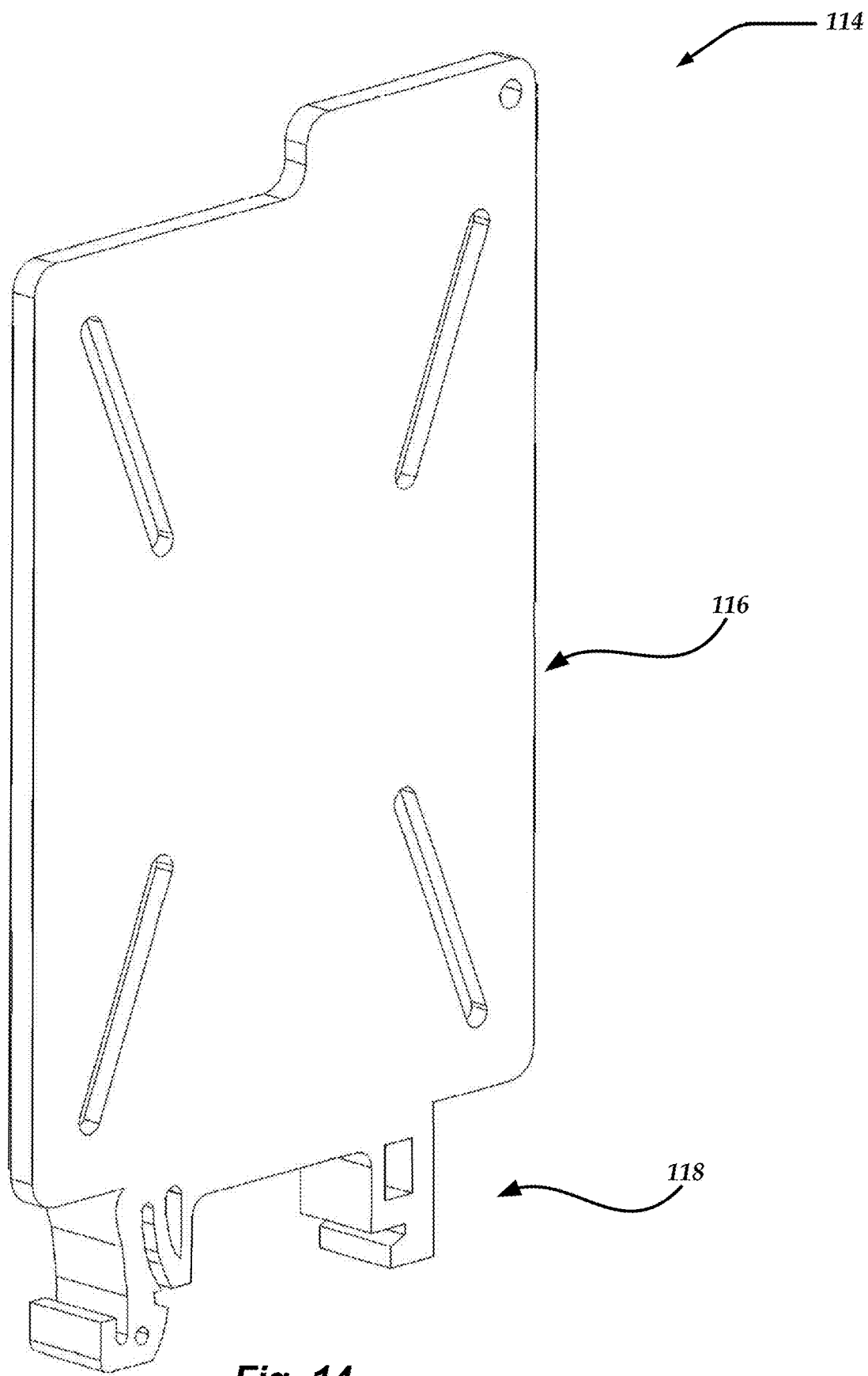
FIG. 14 is a rear-left isometric perspective view of the mounting device of FIG. 13.

FIG. 11 shows a table and key to illustrate mounting-hole patterns of several common circuit boards, with the dimensions being provided in millimeters. When the portion of the plate 14 shown in FIGS. 8-10 is superimposed on a scatter-plot that plots the dimensions listed in the table of FIG. 11, it is demonstrated that the device 2 facilitates receiving and securing all of the circuit boards listed in such table (see FIG. 12). Longer arms and slots may be utilized, but the dimensions shown are substantially the preferred dimensions because excessively long arms results in less table mounting under the weight of the circuit board relative to the distance to the base-mounting fastener and because excessively long slots decreases the rigidity of the plate 14. In combination with such arrangement, the orientation of the slots relative to the outer perimeter edge of a substantially rectangular circuit board also changes the range of hole patterns that the device 2 is configured to receive. As shown in FIGS. 12-14, the slots are preferably disposed at an acute angle relative to a first dimension of the plate 14, such as the central long dimension (labeled as the X-dimension in FIG. 12), and an acute angle relative to a second dimension of the plate 14 that is coplanar with and orthogonal to the first dimension, such as the central short dimension (labeled as the Y-dimension in FIG. 12). The slots on a given side of one of the first or second dimensions (for example, the X-dimension in FIG. 12) are preferably oriented such that their longitudinal axes form an obtuse angle. The slots on a given side of the other of the first or second dimensions (for example, the Y-dimension in FIG. 12) are preferably oriented such that their longitudinal axes for an acute angle.

Figure 15:
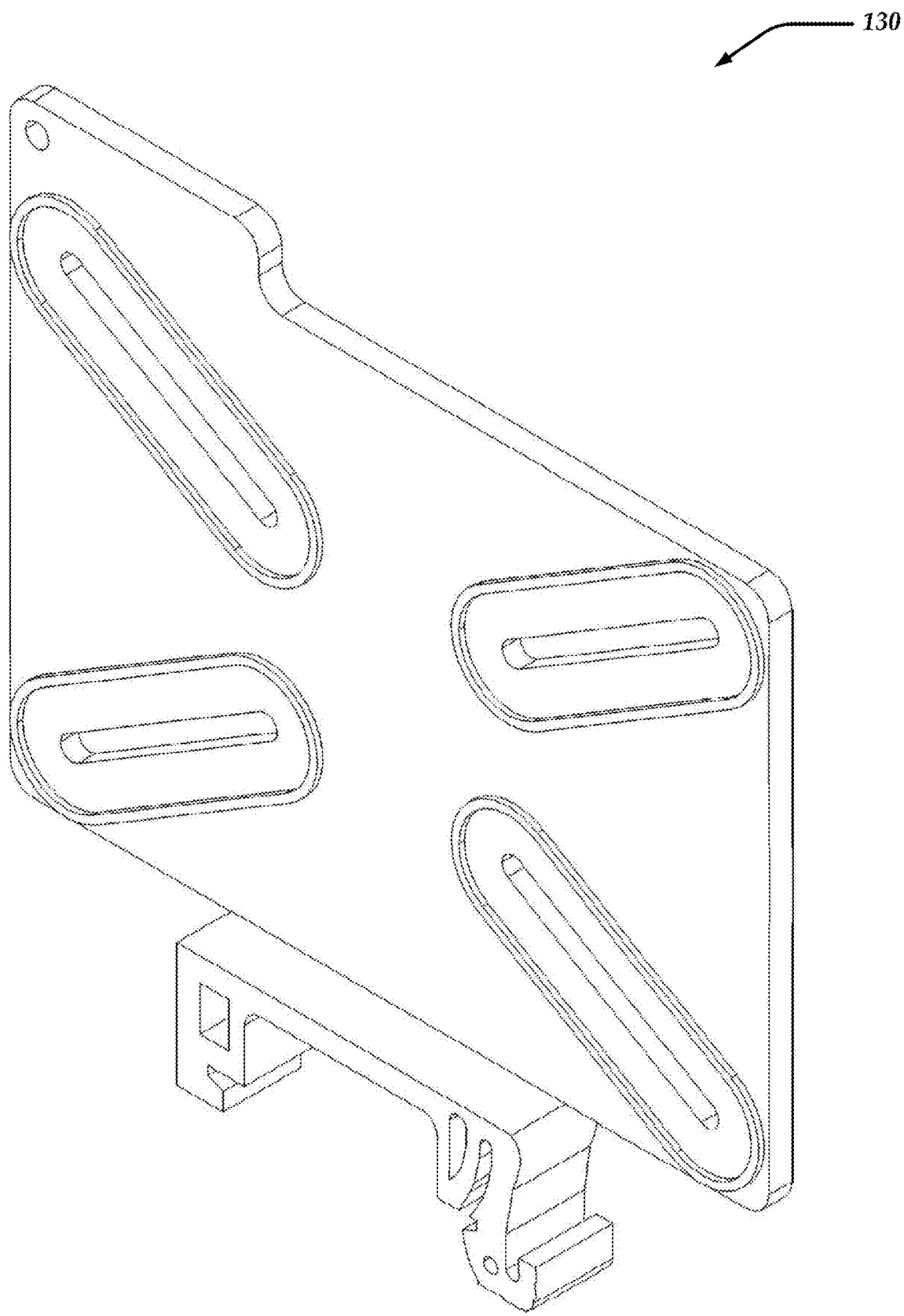
FIG. 15 is a front-left isometric perspective view of another preferred mounting device for printed circuit boards.
Figure 16:
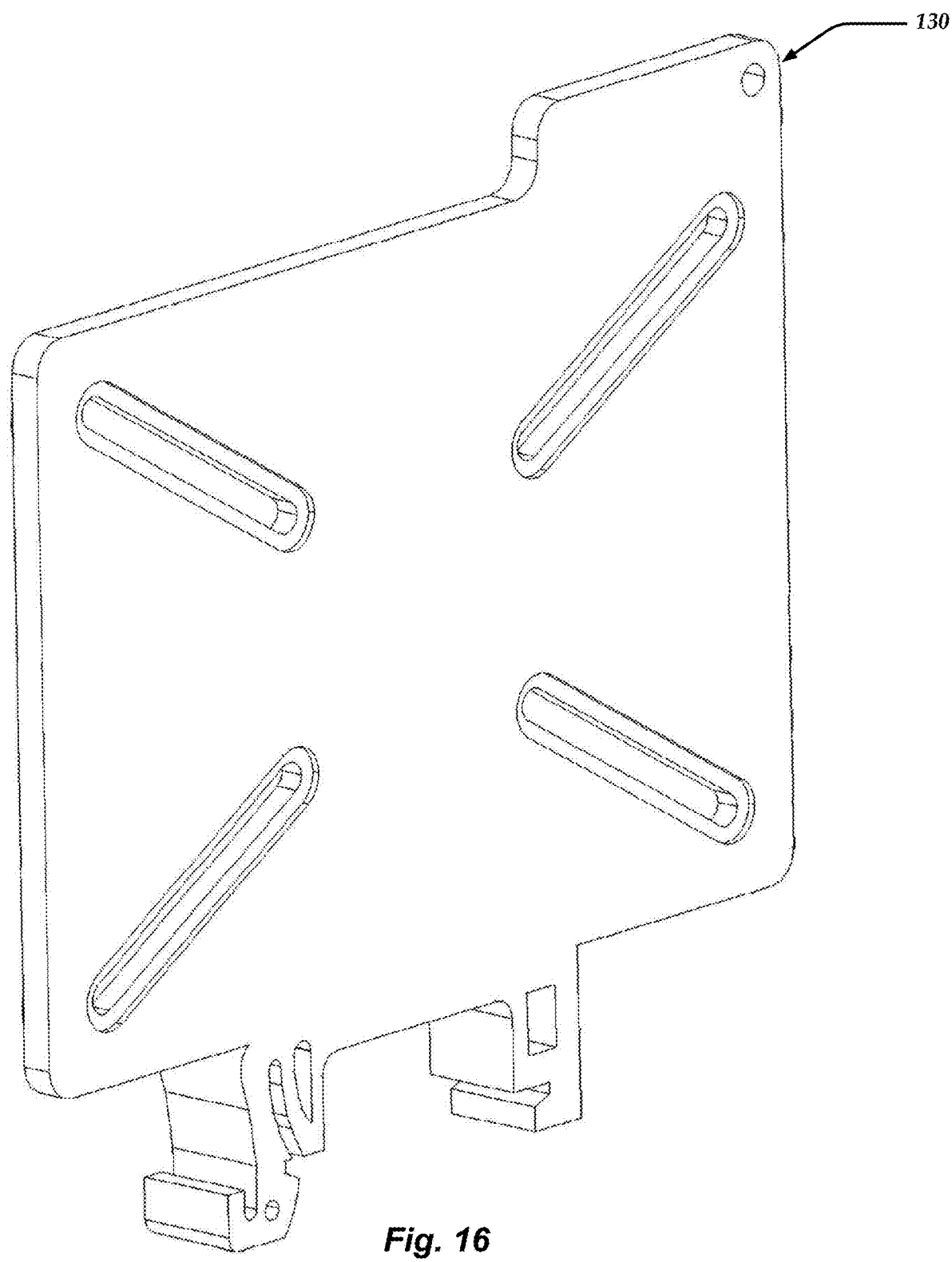
FIG. 16 is a rear-left isometric perspective view of the mounting device of FIG. 17.
Figure 17:
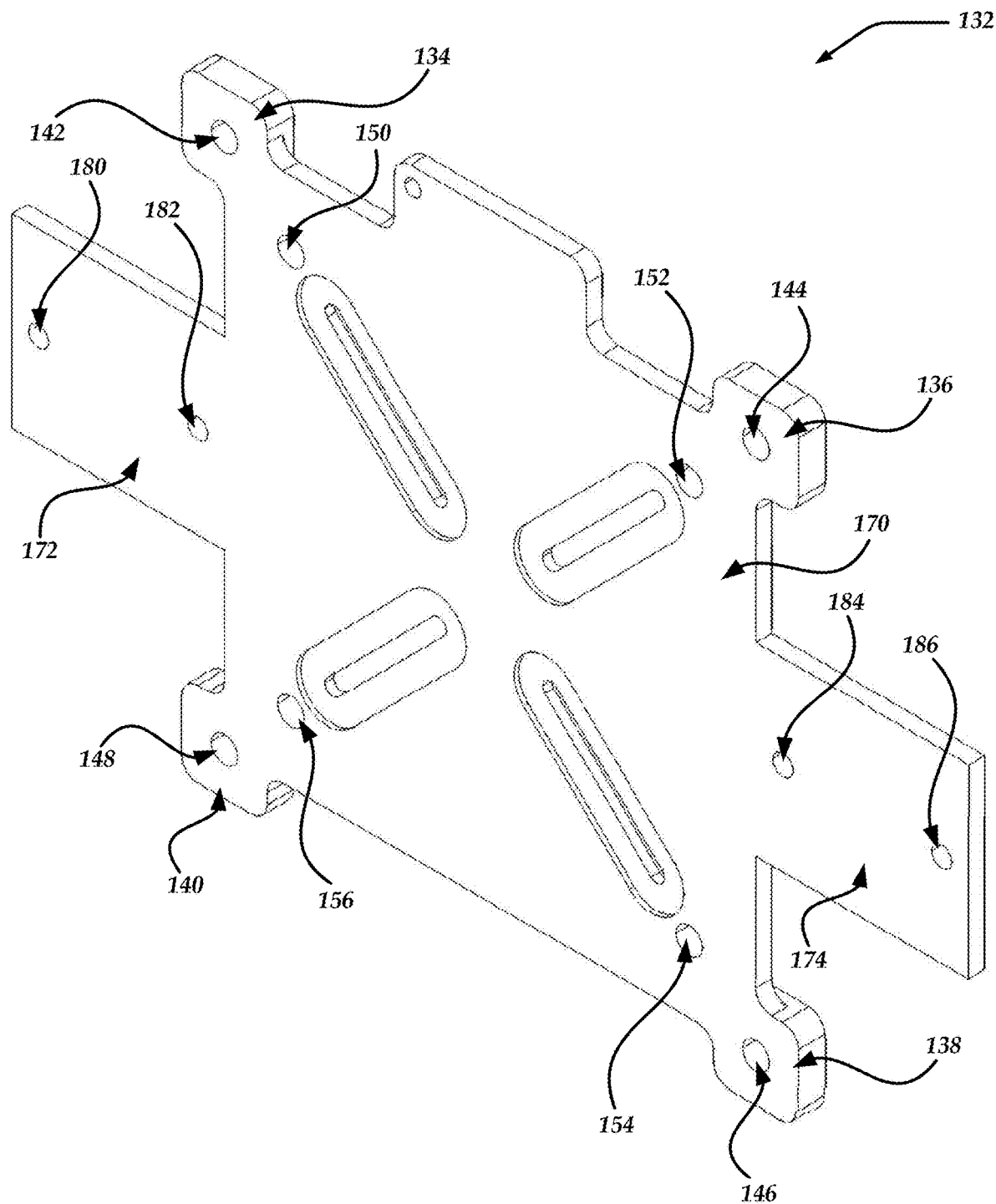
FIG. 17 is a front-left isometric perspective view of another preferred mounting device for printed circuit boards.
Figure 18:
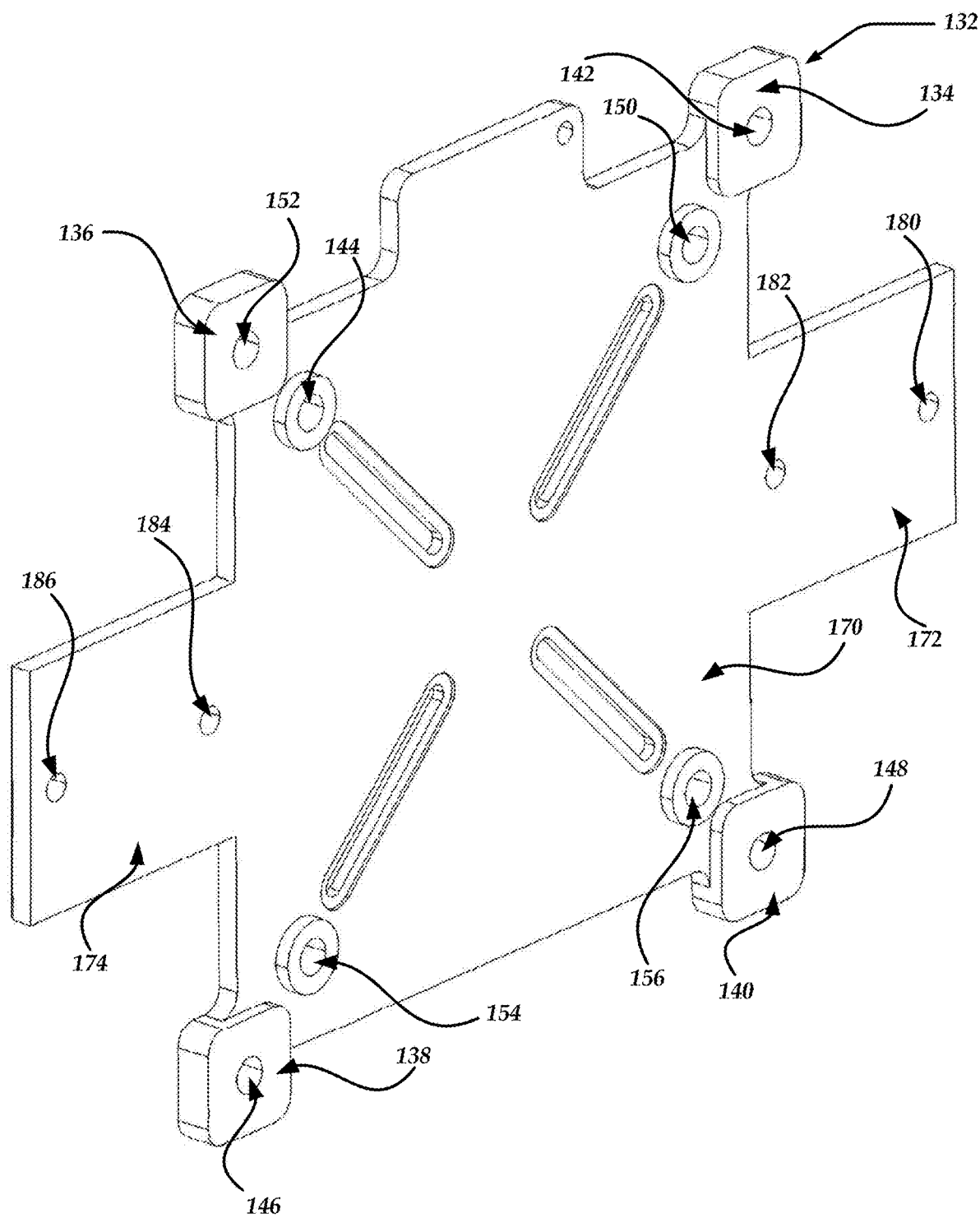
FIG. 18 is a rear-left isometric perspective view of the mounting device of FIG. 17.

The device 2 preferably has a mount mechanism that facilitates mounting the device 2 to another structure, such as the rail mount mechanism 110 that is configured to receive the DIN rail 112 and thereby mount the device 2 to the DIN rail 112. FIGS. 13 and 14 show another version of a mounting device 114 having a mounting plate 116 oriented relative to the mount mechanism 118 at 90° as compared to the mounting plate 14 of the device 2. FIGS. 15 and 16 show another version of a mounting device 130 that has elevated perimeters of the tracks on one side (see FIG. 15) and recessed regions surrounding the slots on the other side (see FIG. 16) to facilitate recessing the fastener heads in a counterbored or countersunk configuration. FIGS. 17 and 18 show another version of a mounting device 132 that has another mount mechanism, such as structure interfaces 134-140 that define structure-mount holes 142-148. The structure-mount holes 142-148 are preferably configured to receive plate-securing fasteners 162-168 to facilitate coupling the device 130 to a structure that complies with the FDMI standard (see FIGS. 19-21), also known as Video Electronics Standards Association ("VESA") Mounting Interface Standard (MIS) or colloquially as a VESA mount, which is a family of standards defined by VESA (for example, the monitor shown in FIGS. 19-21 that has screw holes in a pattern that conform to the FDMI standard). In some versions, the plate 170 of the device 132 forms the mount mechanism and defines the structure-mount holes, such as structure-mount holes 150-156 (see FIGS. 17 and 18).

Figure 19:
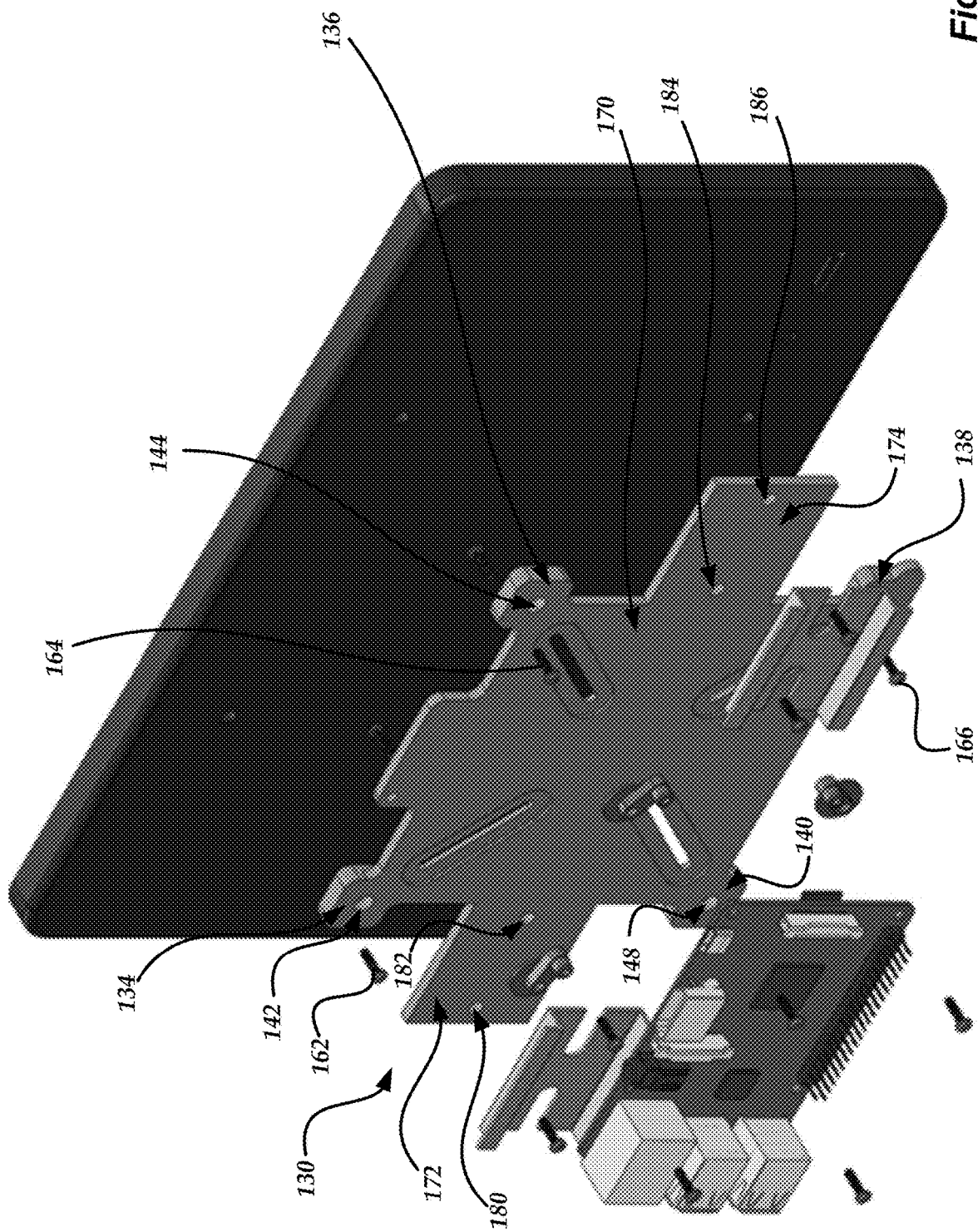
FIG. 19 is a front-left isometric perspective exploded view of the mounting device of FIG. 17 with a monitor that complies with the FDMI standard, two DIN rails, and a printed circuit board.
Figure 20:
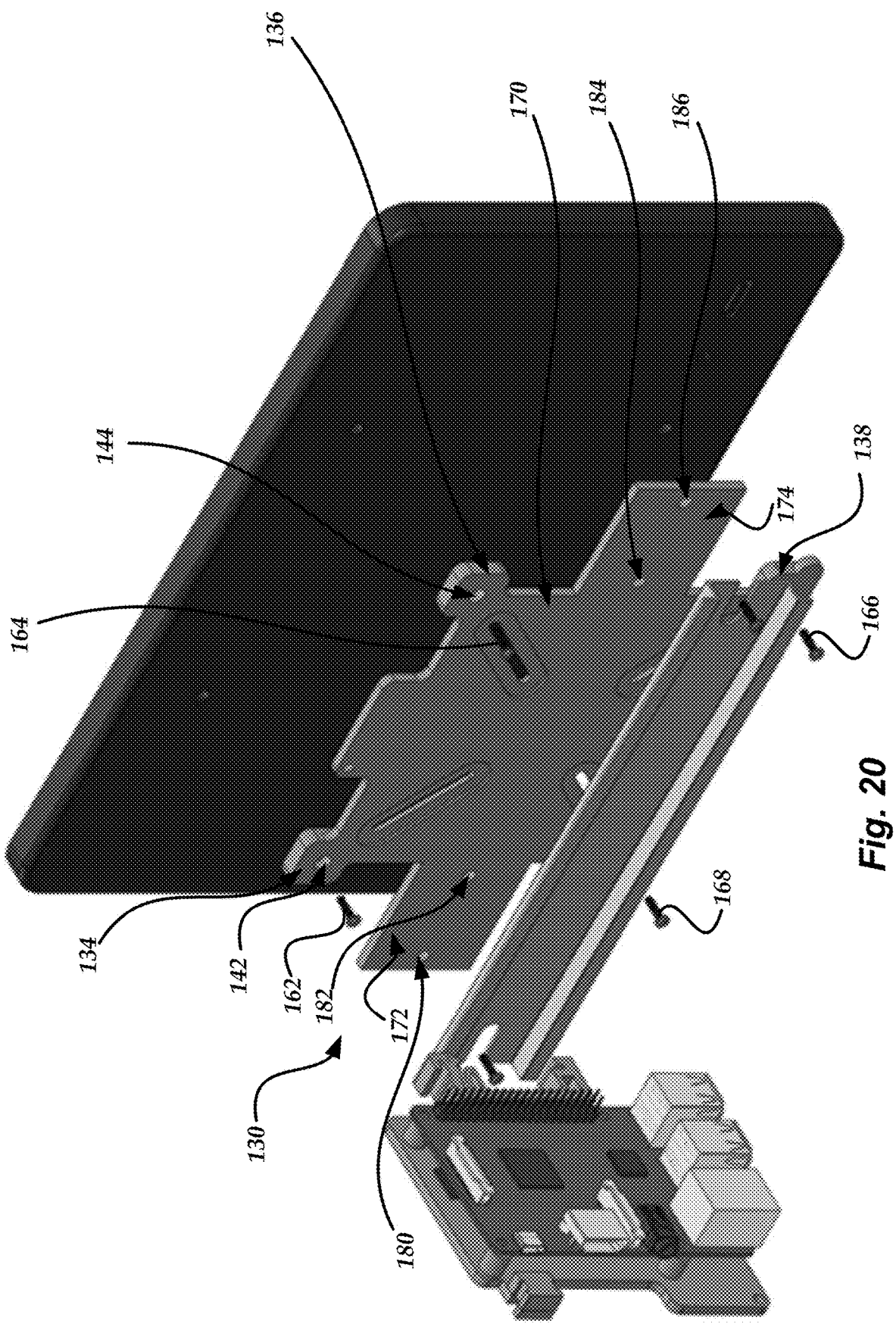
FIG. 20 is a front-left isometric perspective exploded view of the mounting device of FIG. 17 with a monitor that complies with the FDMI standard, a DIN rail, and a printed circuit board mounted on another mounting device that is configured to couple to the DIN rail.

The device 132 preferably has one or more rail receivers, such as rail receivers 172 and 174, that are configured to receive mounting structures such as DIN rails (see FIGS. 17-21). The rail receivers 172, 174 preferably define rail-mount holes, such as rail-mount holes 180-186 (see FIGS. 17 and 18), that are configured to receive rail-securing fasteners, such as rail-securing fasteners 188-194 (see FIGS. 19-21), to facilitate securing one or more rails to the device 132. The rail receivers 172, 174 are preferably configured to facilitate receiving DIN rails without impeding the standoffs coupled to the plate 170 to facilitate the standoffs receiving a circuit board, as shown in FIG. 19. The rail receivers 172, 174 are preferably configured to receive a DIN rail that extends from one of the rail receivers 172 to the other 174 to facilitate receiving a large DIN rail, as shown in FIG. 20. The rail receivers 172, 174 are preferably configured to receive DIN rails without impeding the ability of the device 132 from receiving a VESA stand with the plate 170 disposed between the stand and the VESA conforming structure such as a monitor, as shown in FIG. 21. As shown in FIG. 18, the mount mechanisms that are configured to couple to a surface of a structure that is substantially parallel to the majority of the rear surface of the plate 170 are preferably rearwardly elevated relative to the majority of the rear surface of the plate 170 by a distance that is at least as great as the largest amount that a fastener head extends rearward of the majority of the rear surface of the plate 170, such as a fastener disposed in one of the rail receivers 172, 174. In other versions, all holes in the device 132 that are configured to receive fasteners with the heads of the fasteners disposed rearward of the plate 170 have countersinks or counterbores to facilitate such fastener heads being substantially flush with the majority of the rear surface of the plate 170.

As used herein, the following terms take the meanings explicitly associated herein, unless the context clearly dictates otherwise. The term "or" is an inclusive grammatical conjunction to indicate that one or more of the connected terms may be employed. For example, the phrase "one or more A, B, or C" or the phrase "one or more As, Bs, or Cs" is employed to discretely disclose each of the following: i) one or more As, ii) one or more Bs, iii) one or more Cs, iv) one or more As and one or more Bs, v) one or more As and one or more Cs, vi) one or more Bs and one or more Cs, and vii) one or more As, one or more Bs, and one or more Cs. The term "based on" as used herein is not exclusive and allows for being based on additional factors not described. The articles "a," "an," and "the" include plural references. Plural references are intended to also disclose the singular. The term "one or more" discloses no more than a single one or more than one, up to and including all.

The terms "front," "forward," "rear," and "rearward" are defined relative to the plate of the mounting device to orient the reader and do not limit the orientation of the mounting device or described component in a given application. The terms "forward" and "rearward" refer to a position of a component relative to a front or rear side of another component but does not necessarily mean that the described component is aligned in the left and right directions with the other component. The term "transverse" refers to a non-parallel orientation and includes but is not limited to a perpendicular orientation.

The term "configured" refers to an element being one or more of sized, dimensioned, positioned, or oriented to achieve or provide the recited function or result. The term "substantially" refers to the described value or a range of values that include all values within 5, 10, 15, 20, 25, 30, 35, 40, 45, or 50 percent of the described value. The term "substantially parallel" refers to parallel or within 5, 10, 15, 20, 25, 30, 35, 40, or 45 degrees of parallel. The term "substantially flush" refers to flush or plane separation of no more than 5, 10, 15, 20, 25, 30, 35, 40, 45, or 50 percent of a substantially parallel dimension of the relevant component.

The term "directly coupled" refers to a component that contacts (for example, when bolted) or is integral to another component. The term "indirectly coupled" refers to a component that is coupled to one or more other components that are coupled to a second component or one or more further components that are coupled to the second component. The term "coupled" should be understood to disclose both direct and indirect coupling of components or elements that are described as being coupled to each other.

While the preferred embodiment of the invention has been illustrated and described, as noted above, many changes can be made without departing from the spirit and scope of the invention. For example, each disclosure of an element or component preferably having a feature or characteristic is intended to also disclose the element or component as being devoid of that feature or characteristic, unless the principles of the invention clearly dictate otherwise. Accordingly, the scope of the invention is not limited by the disclosure of the preferred embodiments. Instead, the invention should be determined entirely by reference to the claims that follow. Moreover, each feature, characteristic, element, or component described herein may be implemented in combination with one or more other features, characteristics, elements, or components described herein. For example, one or more of the features, characteristics, or elements of the mounting device 2 may be implemented in combination with one or more other features, characteristics, elements, or mounting devices described herein. It should also be noted that the claim dependencies or combinations of elements recited in the claims does not reflect an intention to forgo claiming other subject matter disclosed herein. Instead, this disclosure is intended to also disclose the subject matter of any combination of any two or more of the claims, such that subsequent claim sets may recite that any one of the dependent claims depends from any other one or more claims, up to and including all other claims in the alternative (for example, "The mounting device of any one of the preceding or subsequent claims . . . "). This disclosure is also intended to disclose the subject matter of any one of the dependent claims, as if it was an independent claim, with or without all or a portion of the subject matter of the original independent claim(s) or any other subject matter disclosed herein.

I claim:

1. A mounting device for circuit boards, the mounting device comprising:
   a first standoff configured to receive a circuit board;
   a first track configured to receive the first standoff, wherein the first standoff is configured to move relative to the first track in two dimensions after being received by the first track to facilitate receiving different circuit boards having different sizes or dimensions,
   a second standoff configured to receive the circuit board; and
   a second track configured to receive the second standoff, wherein the second standoff is configured to move relative to the second track after being received by the second track, the first track having a first longitudinal axis, the second track having a second longitudinal axis that is oriented at an acute angel relative to the first longitudinal axis or is oriented at an obtuse angle relative to the first longitudinal axis.

2. The mounting device of claim 1, wherein the first standoff is configured to translate relative to the first track and rotate relative to the first track.

3. The mounting device of claim 1, wherein the first standoff has a base configured to be received by the first track and an arm having a proximal end portion coupled to the base and a distal end portion opposite the proximal end portion, the distal end portion being configured to receive the circuit board.

4. The mounting device of claim 3, wherein the base is configured to translate relative to the first track, and the arm is configured to rotate relative to the first track.

5. The mounting device of claim 3, wherein the first standoff or the first track is configured to enable the proximal end portion to be disposed at a position when the arm is disposed in a first orientation and to enable the proximal end portion to be disposed at the position when the arm is disposed in a second orientation that is transverse to the first orientation.

6. The mounting device of claim 3, wherein the first track has an effective length that is at least twice as long as an effective length of the arm, the effective length of the arm being defined by a distance between an axis around which the arm is configured to rotate and a center of the distal end portion of the arm that is configured to receive the circuit board, the first track being configured to allow the first standoff to move from a first position where the axis is disposed at a first location to a second position where the axis is disposed at a second location, the effective length of the first track being defined by a distance between the first location and the second location.

7. The mounting device of claim 3, wherein the first track has an elevated portion and a recessed portion, the elevated portion and the recessed portion being spaced apart by a distance, the arm having a bottom surface that has a height relative to a bottom surface of the base, the height being at least as great as the distance.

8. The mounting device of claim 3, wherein the first standoff has a spacer disposed at the distal end portion of the arm, the spacer being configured to define a gap between the arm and a surface of the received circuit board that faces the first standoff.

9. The mounting device of claim 3, wherein the arm has a length that is greater than a width of the first track as measured in a plane that is substantially parallel to the arm when the first standoff is received by the first track.

10. The mounting device of claim 1, wherein the first standoff defines a base-mounting hole, and the first track defines a slot, the base-mounting hole and the slot being configured to receive a standoff-securing fastener to couple the first standoff to the first track.

11. The mounting device of claim 1, further comprising:
a second standoff configured to receive the circuit board; and
a second track configured to receive the second standoff, wherein the first standoff and the second standoff are configured to receive a first circuit board that is shaped and dimensioned such that the first circuit board does not overlap the first track and does not overlap the second track when received by the first standoff and the second standoff and viewed from a direction that is substantially orthogonal to a surface of the first circuit board that faces the first standoff and the second standoff.

12. The mounting device of claim 11, wherein the first standoff and the second standoff are configured to receive a second circuit board that is shaped and dimensioned such that the second circuit board overlaps the first track and overlaps the second track when received by the first standoff and the second standoff and viewed from a direction that is substantially orthogonal to a surface of the second circuit board that faces the first standoff and the second standoff.

13. The mounting device of claim 12, wherein the first standoff and the second standoff are configured to receive a third circuit board that has an asymmetrical mounting-hole pattern.

14. The mounting device of claim 1, further comprising a mount mechanism coupled to the first track and configured to mount the first track to a DIN rail.

15. The mounting device of claim 1, further comprising a mount mechanism coupled to the first track and configured to mount the first track to structure in a manner that complies with FDMI standard.

16. The mounting device of claim 1, further comprising:
a mount mechanism coupled to the first track and configured to mount the first track to a structure in a manner that complies with FDMI standard or to a first DIN rail; and
a rail receiver coupled to the mount mechanism, the rail receiver being configured to receive a second DIN rail.

17. The mounting device of claim 16, wherein the rail receiver is configured to be coupled to the second DIN rail while the first standoff is coupled to the circuit board and the first track.

18. The mounting device of claim 16, wherein the rail receiver is configured to be coupled to the second DIN rail while the first track is disposed between and coupled to the structure and another structure in the manner that complies with the FDMI standard.

19. A mounting device for circuit boards, the mounting device comprising:
a first standoff configured to receive a circuit board;
a first track configured to receive the first standoff, wherein the first standoff is configured to move relative to the first track in two dimensions after being received by the first track to facilitate receiving different circuit boards having different sizes or dimensions;
wherein the first standoff has a base configured to be received by the first track and an arm having a proximal end portion coupled to the base and a distal end portion opposite the proximal end portion, the distal end portion being configured to receive the circuit board; and
wherein the first track has an elevated portion and a recessed portion, the elevated portion and the recessed portion being spaced apart by a distance, the arm having a bottom surface that has a height relative to a bottom surface of the base, the height being at least as great as the distance.

20. The mounting device of claim 19, wherein the first standoff is configured to translate relative to the first track and rotate relative to the first track.

21. The mounting device of claim 19, wherein the base is configured to translate relative to the first track, and the arm is configured to rotate relative to the first track.

22. The mounting device of claim 19, wherein the first standoff has a spacer disposed at the distal end portion of the arm, the spacer being configured to define a gap between the arm and a surface of the circuit board that faces the first standoff.

23. The mounting device of claim 19, wherein the first standoff defines a base-mounting hole, and the first track defines a slot, the base-mounting hole and the slot being configured to receive a standoff-securing fastener to couple the first standoff to the first track.

24. The mounting device of claim 19, wherein the first standoff and the second standoff are configured to receive a second circuit board that has an asymmetrical mounting-hole pattern.

25. The mounting device of claim 19, further comprising a mount mechanism coupled to the first track and configured to mount the first track to a DIN rail.

26. The mounting device of claim 19, further comprising a mount mechanism coupled to the first track and configured to mount the first track to structure in a manner that complies with FDMI standard.

* * * * *